United States Patent
Chudzik et al.

(10) Patent No.: US 7,863,124 B2
(45) Date of Patent: Jan. 4, 2011

(54) RESIDUE FREE PATTERNED LAYER FORMATION METHOD APPLICABLE TO CMOS STRUCTURES

(75) Inventors: Michael Chudzik, Danbury, CT (US);
Bruce B. Doris, Brewster, NY (US);
William K. Henson, Beacon, NY (US);
Hongwen Yan, Somers, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 220 days.

(21) Appl. No.: 11/746,759

(22) Filed: May 10, 2007

(65) Prior Publication Data
US 2008/0280404 A1 Nov. 13, 2008

(51) Int. Cl.
*H01L 21/8238* (2006.01)
(52) U.S. Cl. .............. 438/199; 438/694; 438/695; 257/E21.202
(58) Field of Classification Search .......... 257/E21.202; 438/199, 694, 695
See application file for complete search history.

(56) References Cited

U.S. PATENT DOCUMENTS

| 6,043,157 | A | 3/2000 | Gardner et al. |
| 6,284,637 | B1 * | 9/2001 | Chhagan et al. ............. 438/594 |
| 6,727,130 | B2 * | 4/2004 | Kim et al. ................... 438/199 |
| 6,746,943 | B2 | 6/2004 | Takayanagi et al. |
| 6,794,234 | B2 | 9/2004 | Polishchuk et al. |
| 7,015,049 | B2 * | 3/2006 | Egger et al. .................... 438/3 |
| 2002/0113294 | A1 | 8/2002 | Rhee et al. |
| 2007/0228480 | A1 * | 10/2007 | Yen et al. .................... 257/369 |

* cited by examiner

*Primary Examiner*—Bradley K Smith
*Assistant Examiner*—Marvin Payen
(74) *Attorney, Agent, or Firm*—Scully, Scott, Murphy & Presser, P.C.; Louis J. Percello, Esq.

(57) ABSTRACT

A method for forming a microelectronic structure uses a mask layer located over a target layer. The target layer may be etched while using the mask layer as an etch mask to form an end tapered target layer from the target layer. An additional target layer may be formed over the end tapered target layer and masked with an additional mask layer. The additional target layer may be etched to form a patterned additional target layer separated from the end tapered target layer and absent an additional target layer residue adjacent the end tapered target layer. The method is useful for fabricating CMOS structures including nFET and pFET gate electrodes comprising different nFET and pFET gate electrode materials.

31 Claims, 5 Drawing Sheets

RESIDUE FREE PATTERNED LAYER FORMATION METHOD APPLICABLE TO CMOS STRUCTURES

BACKGROUND

1. Field of the Invention

The invention relates generally to residue free patterned layer formation. More particularly, the invention relates to residue free patterned layer formation applicable to CMOS structures.

2. Description of the Related Art

CMOS structures comprise a complementary doped pair of field effect transistor (FET) devices that include an nFET device and a pFET device. The use of complementary doped pairs of field effect transistors when fabricating CMOS structures is desirable in semiconductor fabrication since such complementary doped pairs of field effect transistors typically provide for reduced power consumption within CMOS structures.

Recent advances in CMOS structure fabrication have centered around the use of different materials, including in particular different semiconductor channel materials, different gate dielectric materials and different gate electrode materials, for fabricating nFET devices in comparison with pFET devices within CMOS structures. In general, charge carrier mobility enhancements may be effected within both nFET devices and pFET devices by a particular selection of a semiconductor substrate channel material and crystallographic orientation, including related mechanical stress effects thereon. In addition, different gate dielectric materials for nFET devices and pFET devices provide for differing capacitive effects within CMOS structures. Finally, different gate electrode materials selections for nFET devices and pFET devices within CMOS structures often provide for different work functions that in turn also influence operating characteristics of the nFET devices and the pFET devices.

The use of different materials of construction for nFET devices and pFET devices within CMOS structures clearly provides performance advantages of the nFET devices and the pFET devices within the CMOS structures. However, the use of different materials of construction for nFET devices and pFET devices within CMOS structures is clearly also not entirely without problems. In particular, the use of different materials for fabricating nFET devices and pFET devices within CMOS structures often presents difficulties with respect to efficient device fabrication, including residue free materials processing when fabricating the nFET devices and the pFET devices.

Various CMOS structures, and methods for fabrication thereof, are known in the semiconductor fabrication art.

For example, Rhee et al., in U.S. Pub. No. 2002/0113294, teaches a CMOS semiconductor structure and a method for fabricating the same that uses differing spatial distributions of the same germanium concentration within an nFET polysilicon gate electrode and a pFET polysilicon gate electrode within the CMOS structure. The differing spatial distributions of the same germanium concentration are used for addressing depletion effects within the nFET polysilicon gate electrode and the pFET polysilicon gate electrode.

In addition, Takayanagi et al., in U.S. Pat. No. 6,746,943, teaches a CMOS structure and a method for fabricating the same that includes a polysilicon-germanium alloy nFET gate electrode and a polysilicon-germanium alloy pFET gate electrode having different germanium concentrations. The different germanium concentrations allow for addressing different dopant activation properties of n dopants and p dopants within the nFET gate electrode and the pFET gate electrode within the CMOS structure.

Finally, Polischuck et al., in U.S. Pat. No. 6,794,234, teaches a CMOS structure and a method for fabricating the CMOS structure that provides an nFET gate electrode and a pFET gate electrode with different work functions within the CMOS structure. The different work functions for the nFET gate electrode and the pFET gate electrode provide for enhanced performance of the individual nFET device and pFET device within the CMOS structure.

Semiconductor device and semiconductor structure dimensions are certain to continue to decrease as semiconductor technology advances. Thus, desirable are CMOS structures, and methods for fabrication thereof, that provide nFET devices and pFET devices with enhanced performance, absent involved processing sequences that provide processing residues within the CMOS structures.

SUMMARY

The invention in broad terms includes a method for forming a patterned target layer within a microelectronic structure. The patterned target layer may be used in a CMOS structure as a gate electrode material layer. The particular method for forming the patterned target layer provides the patterned target layer with a tapered end. The tapered end of the patterned target layer is desirable insofar as when forming an additional layer upon the patterned target layer and subsequently etching the additional layer from the patterned target layer to provide an additional patterned layer separated from the patterned target layer, a residue of the additional layer is not formed upon or adjacent the patterned target layer (i.e., absent the tapered end of the patterned target layer a spacer like residue material from the additional layer is formed adjacent a perpendicular end of the patterned target layer). The absence of such an additional layer residue is desirable when fabricating a CMOS structure when the patterned target layer is used as a first gate electrode material layer within a CMOS structure and the additional patterned layer is used as a second gate electrode material layer within the CMOS structure.

A particular method for forming a patterned layer in accordance with the invention includes forming a mask layer over a target layer located over a substrate. This particular method also includes etching the target layer while using the mask layer as an etch mask to provide a tapered target layer located over the substrate. The tapered target layer has an end taper from about 30 to about 80 degrees with respect to a plane of the substrate.

A particular method for forming a microelectronic structure in accordance with the invention includes forming a mask layer over a target layer located over a substrate. This particular method also includes etching the target layer while using the mask layer as an etch mask, and while using a first etch method, to form a tapered target layer located over the substrate. This particular method also includes stripping the mask layer from the tapered target layer. This particular method also includes forming an additional target layer over the tapered target layer and forming an additional mask layer over the additional target layer. Finally this particular method also includes etching the additional target layer from over the tapered target layer while using the additional mask layer as an etch mask layer, and while using a second etch method, to form a patterned additional target layer laterally separated from the tapered target layer over the substrate, absent an additional target layer residue adjacent the tapered target layer A particular method for fabricating a CMOS structure in accordance with the invention includes forming a first mask over a first gate electrode material layer located over a semiconductor substrate. This particular method also includes etching the first gate electrode material layer while using the first mask as an etch mask to form a tapered first gate electrode material layer located over the semiconductor substrate. This particular method also includes stripping the first mask from the tapered first gate electrode material layer. This particular method also includes forming a second gate electrode material layer over the tapered first gate electrode material layer and forming a second mask over the second gate electrode material layer. This particular method also includes etching the second gate electrode material layer to form a patterned second gate electrode material layer laterally separated from the tapered first gate electrode material layer absent a residue of the second gate electrode material layer adjacent the tapered first gate electrode material layer.

Another particular method for fabricating a CMOS structure in accordance with the invention includes forming a first mask over a first gate electrode material layer located over a first semiconductor material layer within a semiconductor substrate. This particular method also includes etching the first gate electrode material layer while using the first mask as an etch mask to form a tapered first gate electrode material layer located over the first semiconductor material layer. This particular method also includes stripping the first mask from the tapered first gate electrode material layer. This particular method also includes forming a different second gate electrode material layer over the tapered first gate electrode material layer and over a different second semiconductor material layer within the semiconductor substrate, and forming a second mask over the second gate electrode material layer and the second semiconductor material layer. This particular method also includes etching the second gate electrode material layer to form a patterned second gate electrode material layer located over the second semiconductor material layer and laterally separated from the tapered first gate electrode material layer located over the first semiconductor material layer, absent a residue of the second gate electrode material layer adjacent the tapered first gate electrode material layer.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The invention, which includes a method for fabricating a patterned layer which in part may be used as a gate electrode material layer within a CMOS structure, is understood within the context of the description that follows. The description that follows is understood within the context of the drawings described above. Since the drawings are intended for illustrative purposes, the drawings are not necessarily drawn to scale.

While the following description describes an embodiment of the invention within the context of forming a residue free gate electrode material layer within a CMOS structure, neither the embodiment nor the invention is so limited. Rather, the embodiment and the invention may be directed towards fabricating residue free patterned layers within microelectronic structures in general. Such residue free patterned layers may comprise materials including but not limited to conductor materials, semiconductor materials and dielectric materials. Such residue free patterned layers may be used within microelectronic fabrication including but not limited to semiconductor fabrication, ceramic substrate fabrication and optoelectronic fabrication.

Figure 1:
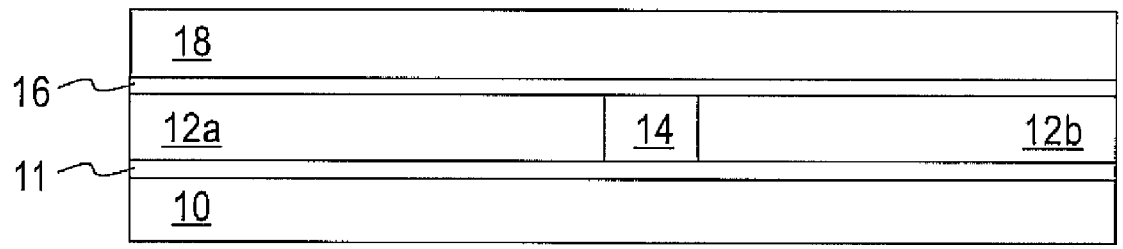
FIG. 1 to FIG. 13 show a series of schematic cross-sectional diagrams illustrating the results of progressive stages in fabricating a CMOS structure in accordance with a particular embodiment of the invention.

FIG. 1 to FIG. 13 show a series of schematic cross-sectional diagrams illustrating the results of progressive stages in fabricating a CMOS structure in accordance with a particular embodiment of the invention. This particular embodiment of the invention comprises a preferred embodiment of the invention. FIG. 1 shows a schematic cross-sectional diagram of the CMOS structure at an early stage in the fabrication thereof in accordance with this preferred embodiment.

FIG. 1 shows a semiconductor substrate 10. A buried dielectric layer 11 is located upon the semiconductor substrate 10. A plurality of surface semiconductor layers 12a and 12b that is separated by an isolation region 14 is located upon the buried dielectric layer 11. In an aggregate, the semiconductor substrate 10, the buried dielectric layer 11 and the surface semiconductor layers 12a and 12b comprise a semiconductor-on-insulator substrate.

The semiconductor substrate 10 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the semiconductor substrate 10 has a conventional thickness.

The buried dielectric layer 11 may comprise any of several dielectric materials. Non-limiting examples include oxides, nitrides and oxynitrides, particularly of silicon, but oxides, nitrides and oxynitrides of other elements are not excluded. The buried dielectric layer 11 may comprise a crystalline or a non-crystalline dielectric material, with crystalline dielectric materials being highly preferred. The buried dielectric layer 11 may be formed using any of several methods. Non-limiting examples include ion implantation methods, thermal or plasma oxidation or nitridation methods, chemical vapor deposition methods and physical vapor deposition methods. Typically, the buried dielectric layer 11 comprises a conventional thickness of an oxide of the semiconductor material from which is comprised the semiconductor substrate 10.

The surface semiconductor layers 12a and 12b may comprise any of the several semiconductor materials from which the semiconductor substrate 10 may be comprised. The surface semiconductor layers 12a and 12b and the semiconductor substrate 10 may comprise either identical or different semiconductor materials with respect to chemical composition, dopant concentration and crystallographic orientation. Typically, the surface semiconductor layers 12a and 12b have a conventional thickness which may be in a range from about 5 nm to about 500 nm. Preferably, the surface semiconductor layer 12a comprises a 100 silicon or silicon-germanium alloy semiconductor material doped appropriately for fabricating an nFET device therein and thereupon. Preferably, the surface semiconductor layer 12b comprises a 110 silicon or silicon-germanium alloy semiconductor material doped appropriately for fabricating a pFET device therein and thereupon.

The foregoing crystallographic orientations and dopant polarities are not, however, a limitation of the embodiment, or of the invention.

The semiconductor-on-insulator substrate portion of the semiconductor structure that is illustrated in FIG. 1 may be fabricated using any of several methods. Non-limiting examples include lamination methods, layer transfer methods and separation by implantation of oxygen (SIMOX) methods.

Although the instant embodiment illustrates the invention within the context of a semiconductor-on-insulator substrate comprising the semiconductor substrate 10, the buried dielectric layer 11 and the surface semiconductor layers 12a and 12b that preferably include different crystallographic orientations and dopant polarities, neither the embodiment nor the invention is so limited. Rather, the present embodiment may alternatively be practiced using a bulk semiconductor substrate (that would otherwise result from absence of the buried dielectric layer 11 under circumstances where the semiconductor substrate 10 and each of the surface semiconductor layers 12a and 12b, as a group, have an identical chemical composition and an identical crystallographic orientation). The embodiment also more preferably contemplates use of a hybrid orientation (HOT) substrate that has multiple crystallographic orientations within a single semiconductor substrate. Such a hybrid orientation substrate may result, for example, from absence of a portion of the buried dielectric layer 11 interposed between the surface semiconductor layer 12b and the base semiconductor substrate 10. Under such circumstances, the surface semiconductor layer 12b and the base semiconductor substrate 10 are intended as comprising the same semiconductor material having the same crystallographic orientation (i.e., as above, a 110 silicon or silicon-germanium alloy material doped appropriately for fabricating a pFET device).

The isolation region 14 may comprise any of several isolation materials that are generally conventional in the semiconductor fabrication art. Non-limiting examples of particular isolation materials include silicon oxide, silicon nitride and silicon oxynitride isolation materials. Also intended to be included as non-limiting examples are laminates of the foregoing isolation materials and composites of the foregoing isolation materials. The isolation materials may be formed using any of several methods that are generally conventional in the semiconductor fabrication art. Non-limiting examples include chemical vapor deposition methods, plasma enhanced chemical vapor deposition methods and physical vapor deposition methods.

FIG. 1 also shows a first gate dielectric material layer 16 located upon the surface semiconductor layers 12a and 12b, and the isolation region 14. FIG. 1 finally shows a first gate electrode material layer 18 located upon the first gate dielectric material layer 16.

The first gate dielectric material layer 16 may in general comprise any of several conventional gate dielectric materials such as oxides, nitrides and oxynitrides of silicon that have a generally lower dielectric constant from about 4 to about 20, measured in vacuum. Alternatively, the first gate dielectric material layer 16 may also comprise a generally higher dielectric constant dielectric material having a dielectric constant from about 20 to at least about 100. Such higher dielectric constant dielectric materials may include, but are not limited to hafnium oxides, hafnium silicates, titanium oxides, barium-strontium-titanates (BSTs) and lead-zirconate-titanates (PZTs). The first gate dielectric material layer 16 may be formed using any of several methods that are appropriate to its material(s) of composition. Included, but not limiting are thermal or plasma oxidation or nitridation methods, chemical vapor deposition methods and physical vapor deposition methods. Typically, the first gate dielectric material layer 16 comprises a generally lower dielectric constant thermal silicon oxide dielectric material or alternatively a generally lower dielectric constant thermal silicon oxynitride dielectric material, that has a generally conventional thickness that may be, but is not necessarily required to be, in a range from about 10 to about 70 angstroms.

The first gate electrode material layer 18 may comprise gate electrode materials including, but not limited to certain metals, metal alloys, metal nitrides and metal silicides, as well as laminates thereof and composites thereof. The first gate electrode material layer 18 may also comprise doped polysilicon and polysilicon-germanium alloy materials (i.e., having a dopant concentration from about 1e18 to about 1e22 dopant atoms per cubic centimeter) and polycide materials (doped polysilicon/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the first gate electrode material layer 18 comprises a doped polysilicon material or a doped polysilicon-germanium alloy material that has a conventional thickness that is typically in a range from about 200 to about 600 angstroms.

Figure 2:
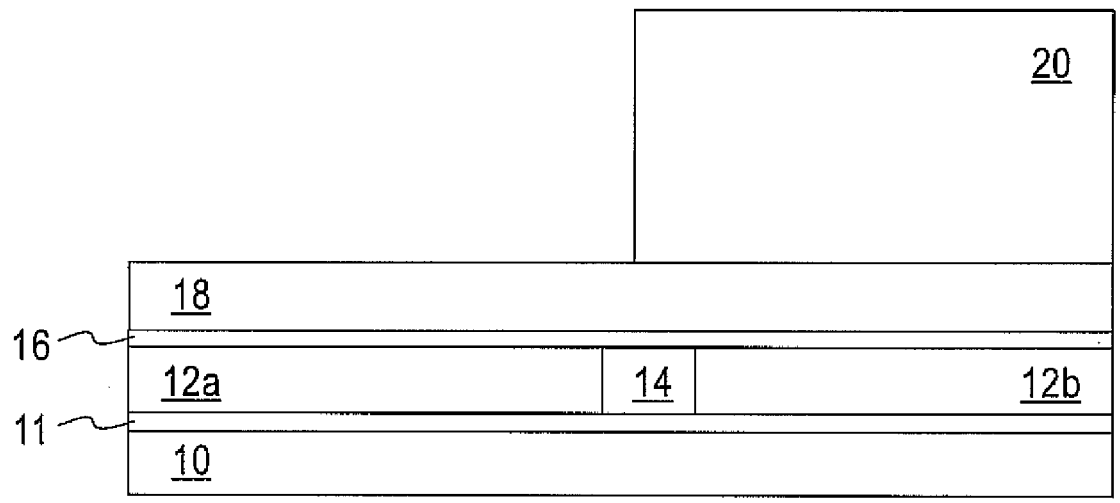

FIG. 2 shows a block mask 20 that covers a right hand portion of the CMOS structure of FIG. 1, including in particular the surface semiconductor layer 12b. The block mask 20 may comprise any of several mask materials, but in particular will typically comprise a photoresist mask material. Suitable options for photoresist mask materials include positive photoresist materials, negative photoresist materials and hybrid photoresist materials. Positive photoresist materials and negative photoresist materials are generally preferred. Typically, the block mask 20 comprises a positive photoresist material or a negative photoresist material that has a conventional thickness.

Figure 3:
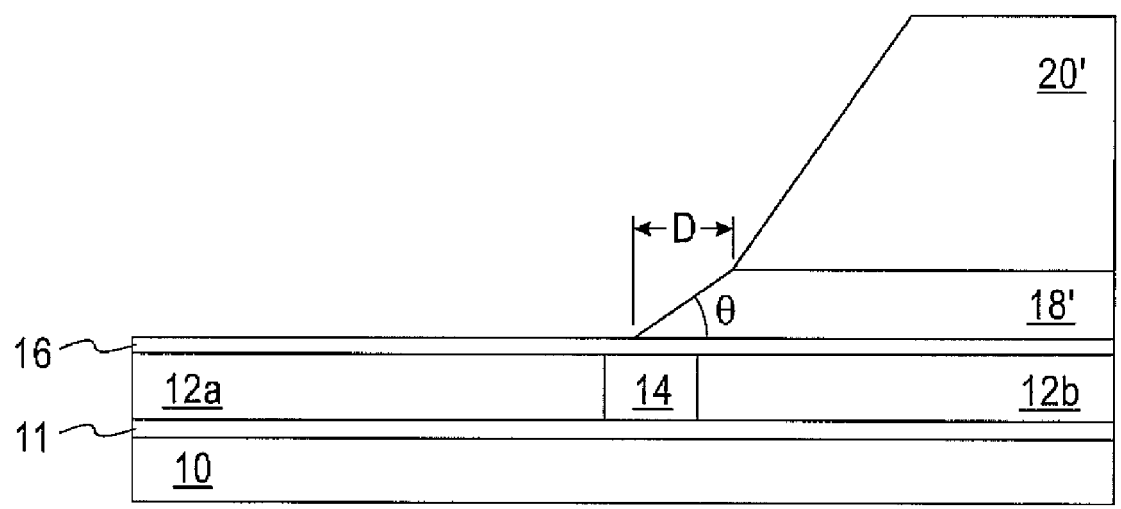

FIG. 3 shows the results of etching the first gate electrode material layer 18 to form a first gate electrode material layer 18' while using the block mask 20 as an etch mask. Notable within the context of the instant embodiment is that the block mask 20 is also etched to form a block mask 20' of reduced and tapered dimensions while the first gate electrode material layer 18 is etched to form the first gate electrode material layer 18'. Also notable within the context of the instant embodiment is that the first gate electrode material layer 18' is formed with an end taper as a result of the simultaneous etching and tapering of the block mask 20 to form the block mask 20'.

As is illustrated within the schematic cross-sectional diagram of FIG. 3, the first gate electrode material layer 18' in particular has a taper angle $\theta$ from about 30 to about 80 degrees, and more preferably from about 45 to about 70 degrees, with respect to the plane of the substrate 10, as well as a taper distance D laterally within the first gate electrode material layer 18' from about 100 to about 400 angstroms.

Within the instant embodiment, when the block mask 20 comprises a photoresist material and the first gate electrode material layer 18 comprises a silicon or silicon-germanium alloy material, a particular etchant that may be used to form the block mask 20' and the first gate electrode material layer 18' (each with the taper that is illustrated in FIG. 3) is a plasma etch method. Other etch methods are not necessarily excluded, but other etch methods, such as wet chemical etch methods, may prove difficult in defining appropriate selective etchant material compositions. In particular, such a desirable plasma etch method will typically include: (1) an oxygen, nitrogen or hydrogen component (along with an optional inert gas component), such as oxygen, ozone, nitrogen, nitrous oxide, nitric oxide, hydrogen, ammonia, argon, helium, carbon monoxide, or carbon dioxide for etching and tapering the block mask 20 when forming the block mask 20'; as well as (2) a halogen component such as but not limited to a fluorine containing etchant gas, a chlorine containing etchant gas or a bromine containing etchant gas, for etching the first gate electrode material layer 18 when forming the first gate electrode material layer 18'.

Typically such a plasma etch method also uses: (1) a reactor chamber pressure from about 5 to about 100 mTorr; (2) a source radio frequency power from about 100 to about 800 watts; (3) a bias (i.e., sputtering) power from about 20 to about 200 watts; (4) an oxygen, nitrogen or hydrogen flow rates from about 5 to about 500 standard cubic centimeters per minute; (5) a halogen containing etchant gas (i.e., such as in particular a sulfur hexafluoride, diatomic chlorine, hydrogen bromide, nitrogen trifluoride, carbon tetrafluoride or trifluoromethane etchant gas) flow rate from about 5 to about 100 standard cubic centimeters per minute; and (6) a diluent gas at a flow rate from about 50 to about 500 standard cubic centimeters per minute.

Figure 4:
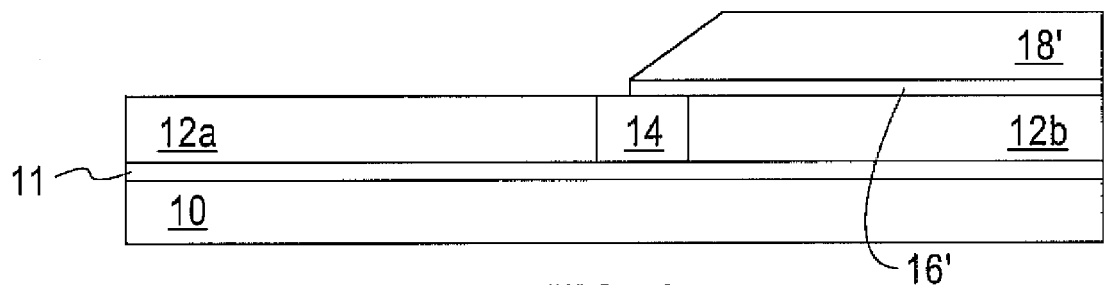

FIG. 4 first shows the results of stripping the block mask 20' from the CMOS structure whose schematic cross-sectional diagram is illustrated in FIG. 3. The block mask 20' may be stripped using methods and materials that are otherwise generally conventional in the semiconductor fabrication art. Included in particular are wet chemical stripping methods, dry plasma stripping methods and aggregate stripping methods thereof. Particularly desirable are the aggregate stripping methods, since such aggregate stripping methods typically provide better semiconductor surface preparation for additional processing of the CMOS structure that is illustrated in FIG. 4.

FIG. 4 also shows the results of etching an exposed portion of the first gate dielectric material layer 16 while using the first gate electrode material layer 18' as a mask, to thus form a first gate dielectric material layer 16'. The foregoing etching may be effected using an appropriate wet chemical etchant. Hydrofluoric acid etchants are in particular appropriate for etching silicon oxide gate dielectric materials, while phosphoric acid etchants are appropriate for etching silicon nitride gate dielectric materials.

Figure 5:
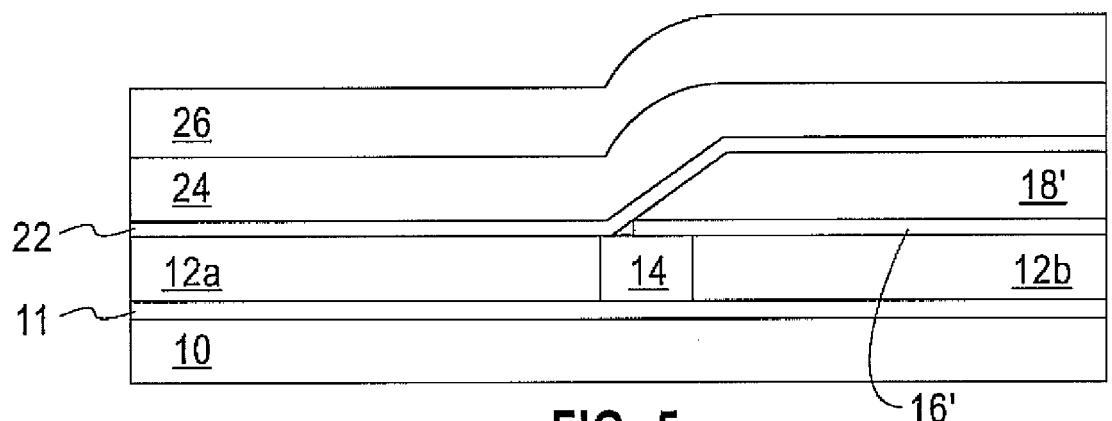

FIG. 5 shows the results of forming a second gate dielectric material layer 22 upon the CMOS structure of FIG. 4. The second gate dielectric material layer 22 is located upon exposed portions of the surface semiconductor layer 12a, the isolation region 14, the first gate dielectric material layer 16' and the first gate electrode material layer 18'. FIG. 5 also shows a second gate electrode material layer 24 located upon the second gate dielectric material layer 22. FIG. 5 finally shows a capping layer 26 located upon the second gate electrode material layer 24.

The second gate dielectric material layer 22 may comprise any of the several gate dielectric materials from which may be comprised the first gate dielectric material layer 16 that is illustrated in FIG. 1. However, within the context of the instant embodiment, the second gate dielectric material layer 22 will typically comprise a different gate dielectric material in comparison with a gate dielectric material from which is comprised the first gate dielectric material layer 16. Within the instant embodiment when the surface semiconductor layer 12a comprises a 100 silicon or silicon-germanium alloy semiconductor material intended for fabricating an nFET therein and thereupon, the second gate dielectric material layer 22 typically comprises a laminated stack including: (1) an oxide or an oxynitride layer having a thickness from about 5 to about 10 angstroms; upon which is located (2) a higher dielectric constant dielectric material layer, such as but not limited to a hafnium oxide material layer or a hafnium-silicon oxide material layer, having a thickness from about 10 to about 50 angstroms.

The second gate electrode material layer 24 may comprise a gate electrode material selected from the same general group of gate electrode materials as the first gate electrode material layer 18. However, within the context of the instant embodiment, the first gate electrode material layer 18 and the second gate electrode material layer 24 will typically also comprise different gate electrode materials. More particularly, when the surface semiconductor layer 12a comprises a silicon or silicon-germanium alloy semiconductor material that has a 100 crystallographic orientation suitably doped for fabricating an nFET, the second gate electrode material layer 24 will typically comprise a metal gate electrode material, a metal nitride gate electrode material or a metal silicide gate electrode material. Particular metals that may be used in the metal, metal nitride or metal silicide gate electrodes include, but are not limited to titanium, tungsten, tantalum, hafnium and vanadium metals, as well as alloys thereof. Most particularly desirable is a metal nitride gate electrode material such as a titanium nitride gate electrode material. Typically, such a titanium nitride gate electrode material has a thickness from about 30 to about 500 angstroms when the same forms the second gate electrode material layer 24.

The capping layer 26 may comprise any of several capping materials that are intended to protect the second gate electrode material layer 24 incident to further processing of the CMOS structure whose schematic cross-sectional diagram is illustrated in FIG. 5. Such capping materials may in general include various compositions of dielectric capping materials and conductive capping materials. Conductive capping materials are desirable insofar as conductive capping materials need not necessarily be stripped incident to further processing of the CMOS structure whose schematic cross-sectional diagram is illustrated in FIG. 5. Similarly, and for reasons that will become clearer within the context of further processing of the semiconductor structure that is illustrated in FIG. 5, a silicon capping material, such as but not limited to an amorphous silicon capping material or a polysilicon capping material, having a thickness from about 100 to about 300 angstroms, is desirable for the capping layer 26, although the embodiment is not necessarily so limited.

Figure 6:
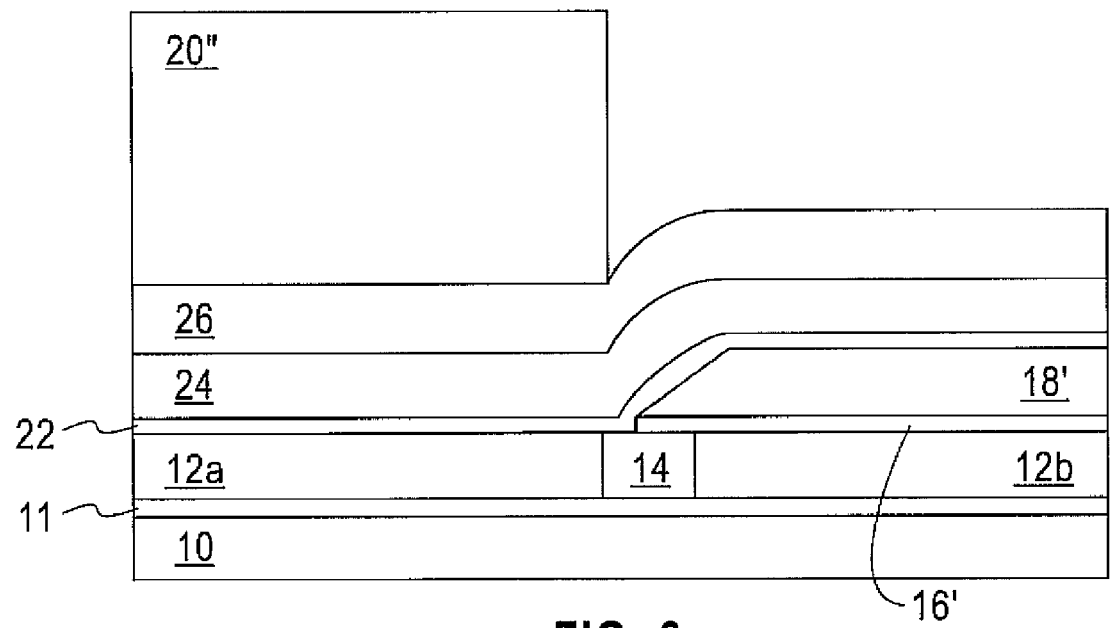

FIG. 6 shows a block mask 20" located covering the left hand portion of the CMOS structure whose schematic cross-sectional diagram is illustrated in FIG. 5. The block mask 20" may comprise materials and have dimensions analogous, equivalent or identical to the materials and dimensions that are used for forming the block mask 20 that is illustrated in FIG. 2. However, as is illustrated within the schematic cross-sectional diagram of FIG. 6, such a block mask is located covering a left hand side of the CMOS structure rather than a right hand side of the CMOS structure.

Figure 7:
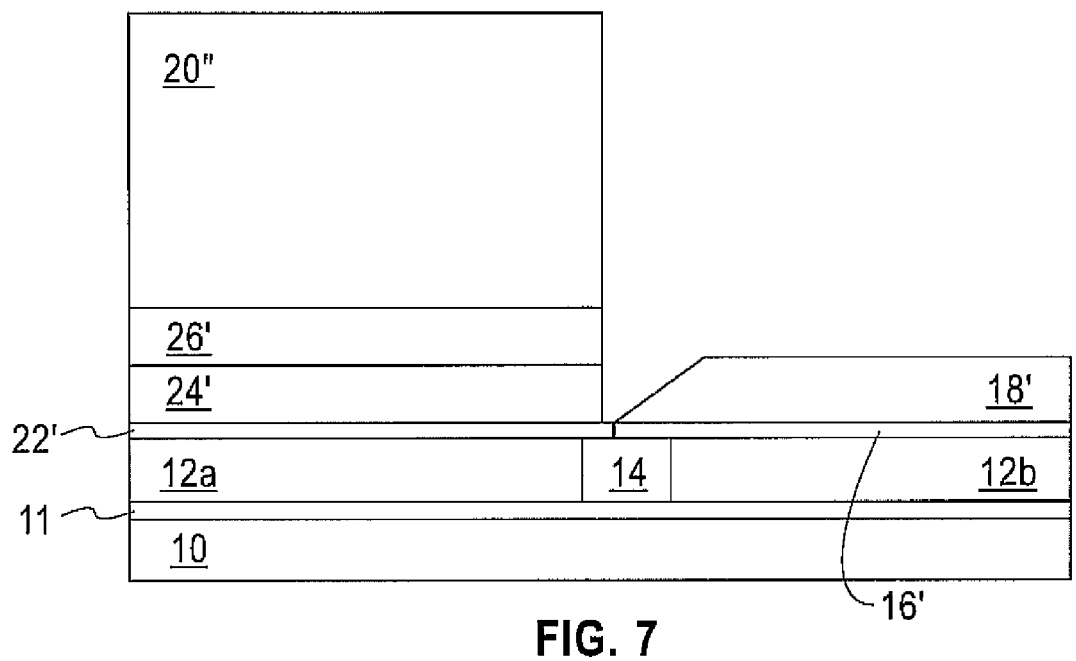

FIG. 7 shows the results of etching the capping layer 26, the second gate electrode material layer 24 and the second gate dielectric material layer 22 from the right hand side of the CMOS structure whose schematic cross-sectional diagram is illustrated in FIG. 6, while using the block mask 20" as an etch mask. The foregoing etching is undertaken using methods and materials that are otherwise generally conventional in the semiconductor fabrication art. Typically, such methods and materials will include anisotropic plasma etch methods that use appropriate etchant gas compositions, and in particular halogen containing etchant gas compositions. Isotropic plasma etch methods are generally not excluded. As is illustrated within the schematic cross-sectional diagram of FIG. 7 in comparison with the schematic cross-sectional diagram of FIG. 3, the block mask 20'' is not tapered incident to etching the capping layer 26, the second gate electrode material layer 24 and the second gate dielectric material layer 22 from the right had portion of the CMOS structure whose schematic cross-sectional diagram is illustrated in FIG. 7 when forming the capping layer 26', the second gate electrode material layer 24' and the second gate dielectric material layer 22' Thus, the plasma etch method that is used for etching the CMOS structure whose schematic cross-sectional diagram is illustrated in FIG. 6 to provide the CMOS structure whose schematic cross-sectional diagram is illustrated in FIG. 7 does not typically contemplate incorporation of an oxidant.

As is understood by a person skilled in the art, since the first gate electrode material layer 18' has a tapered end, when etching the CMOS structure whose schematic cross-sectional diagram is illustrated in FIG. 6 to provide the CMOS structure whose schematic cross-sectional diagram is illustrated in FIG. 7, uncovered portions of the capping layer 26, the second gate electrode material layer 24 and the second gate dielectric material layer 22 may be completely etched absent a residue thereof located upon or near the tapered end of the first gate electrode material layer 18'. The absence of such a residue is desirable incident to further fabrication of the CMOS structure whose schematic cross-sectional diagram is illustrated in FIG. 7 since the absence of such a residue provides for ease in further fabrication of the CMOS structure whose schematic cross-sectional diagram is illustrated in FIG. 7. In particular, the absence of such a residue provides for enhanced etch efficiency incident to further fabrication of the CMOS structure whose schematic cross-sectional diagram is illustrated in FIG. 7 since such residues may not necessarily be readily etched and removed while using plasma etch methods and materials intended for etching material layers that surround such residues.

Figure 8:
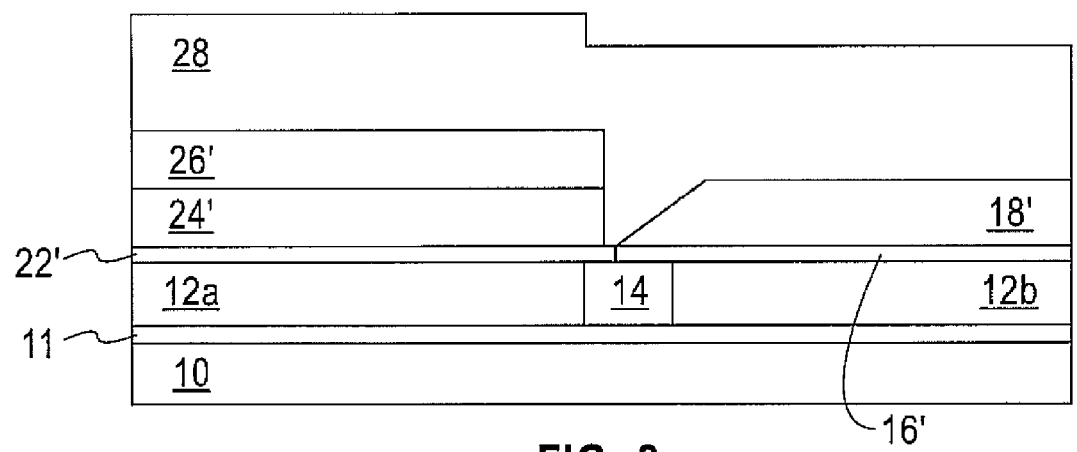

FIG. 8 first shows the results of stripping the block mask 20'' from the CMOS structure whose schematic cross-sectional diagram is illustrated in FIG. 7. The block mask 20'' may be stripped from the CMOS structure whose schematic cross-sectional diagram is illustrated in FIG. 7 to provide in part the CMOS structure whose schematic cross-sectional diagram is illustrated in FIG. 8 while using stripping methods and materials that are analogous, equivalent or identical to the stripping methods and materials that are used from stripping the block mask 20' from the CMOS structure whose schematic cross-sectional diagram is illustrated in FIG. 3 to provide in part the CMOS structure whose schematic cross-sectional diagram is illustrated in FIG. 4.

FIG. 8 also shows a silicon material layer 28 (i.e., generally intended as a supplemental gate electrode material layer) located upon the CMOS structure of FIG. 7 after having stripped therefrom the block mask 20'. The silicon material layer 28 may comprise any of several types of silicon materials, such as but not limited to amorphous silicon materials, polycrystalline silicon materials and related silicon-germanium alloy materials. More particularly, the silicon material layer 28 comprises the same silicon material as used in the first gate electrode material layer 18', and not necessarily the same silicon material as the capping layer 26'. Typically, the silicon material layer 28 has a thickness from about 200 to about 1000 angstroms.

Figure 9:
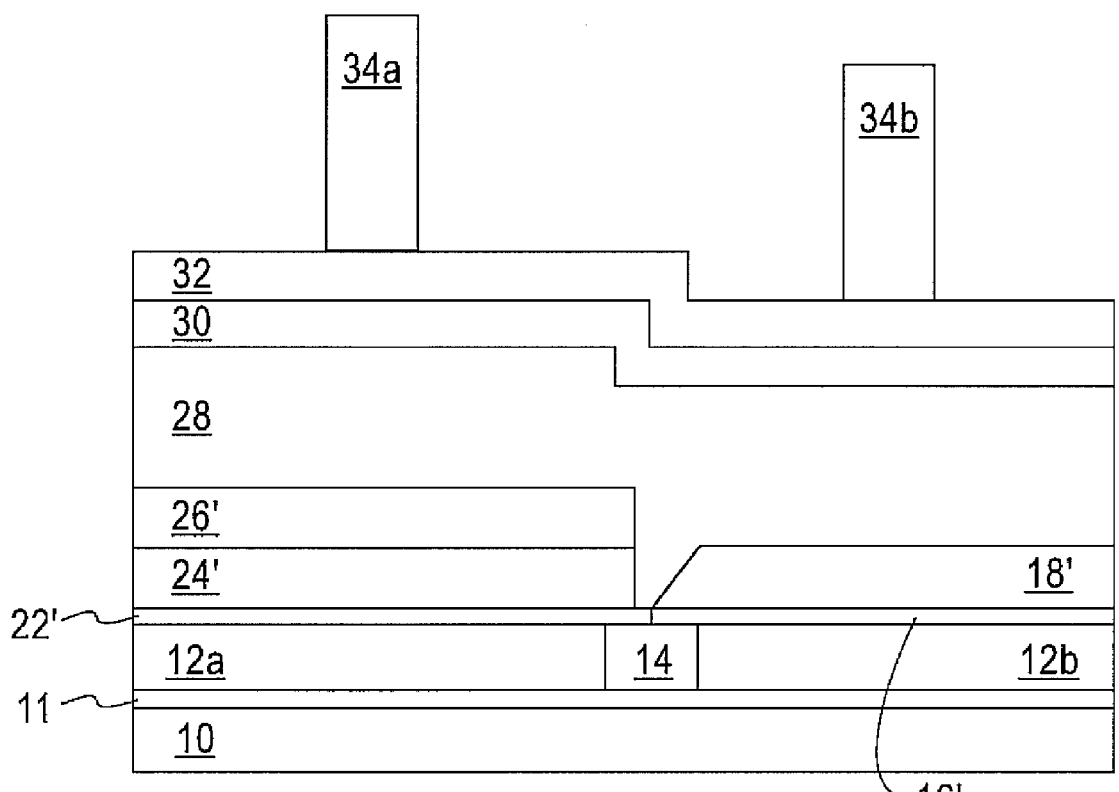

FIG. 9 first shows a hard mask layer 30 located upon the CMOS structure of FIG. 8, and in particular located upon the silicon material layer 28. FIG. 9 also shows an anti-reflective coating layer 32 located upon the hard mask layer 30. FIG. 9 finally shows a plurality of mask layers 34a and 34b located upon the anti-reflective coating layer 32.

The hard mask layer 30 may comprise any of several hard mask materials. Non-limiting examples of hard mask materials include oxides, nitrides and oxynitrides, particularly of silicon. However, oxides, nitrides and oxynitrides of other materials are not excluded. The hard mask materials may be formed using generally conventional methods. Included in particular are chemical vapor deposition methods and physical vapor deposition methods. The hard mask layer 30 may be formed to a conventional thickness.

The anti-reflective coating (ARC) layer 32 comprises an anti-reflective coating material. The anti-reflective coating material may comprise an inorganic anti-reflective coating material or alternatively an organic anti-reflective coating material. Often, but not exclusively, organic anti-reflective coating materials, which comprise dyed polymer materials, are preferred. The anti-reflective coating (ARC) layer 32 may also be formed to a conventional thickness.

The mask layers 34a and 34b may comprise any of the several photoresist materials from which is comprised the block mask 20 that is illustrated in FIG. 3 or the block mask 20'' that is illustrated in FIG. 6. In comparison with the block mask 20 and the block mask 20''', the mask layers 34a and 34b will typically have a narrower linewidth in a range that is conventional for gate electrode fabrication.

Figure 10:
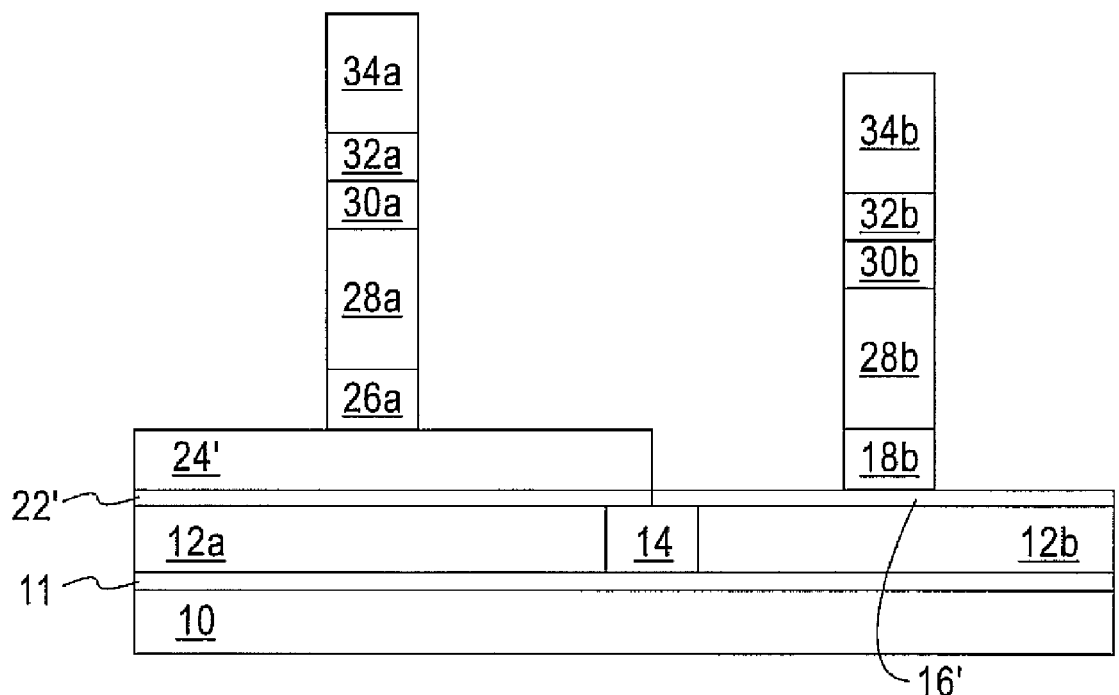

FIG. 10 shows the results of sequentially etching the anti-reflective coating (ARC) layer 32, the hard mask layer 30, the silicon material layer 28, the capping layer 26 and the first gate electrode material layer 18', while using the photoresist layers 34a and 34b as a mask. The foregoing etching provides the corresponding anti-reflective coating layers 32a and 32b, the corresponding hard mask layers 30a and 30b, the corresponding silicon material layers 28a and 28b, the corresponding capping layer 26a and the corresponding first gate electrode material layer 18b. As is illustrated within the schematic cross-sectional diagram of FIG. 10, the foregoing etching stops on the second gate electrode material layer 24' and the first gate dielectric material layer 16'. The foregoing etching may be undertaken using methods and materials that are generally conventional in the semiconductor fabrication art. Similarly with other etching methods within the context of the instant embodiment, the foregoing etching is typically effected using a plasma etch method. Typically, the plasma etch method uses etching materials that are appropriate to the various materials that are etched when forming the foregoing layers.

Figure 11:
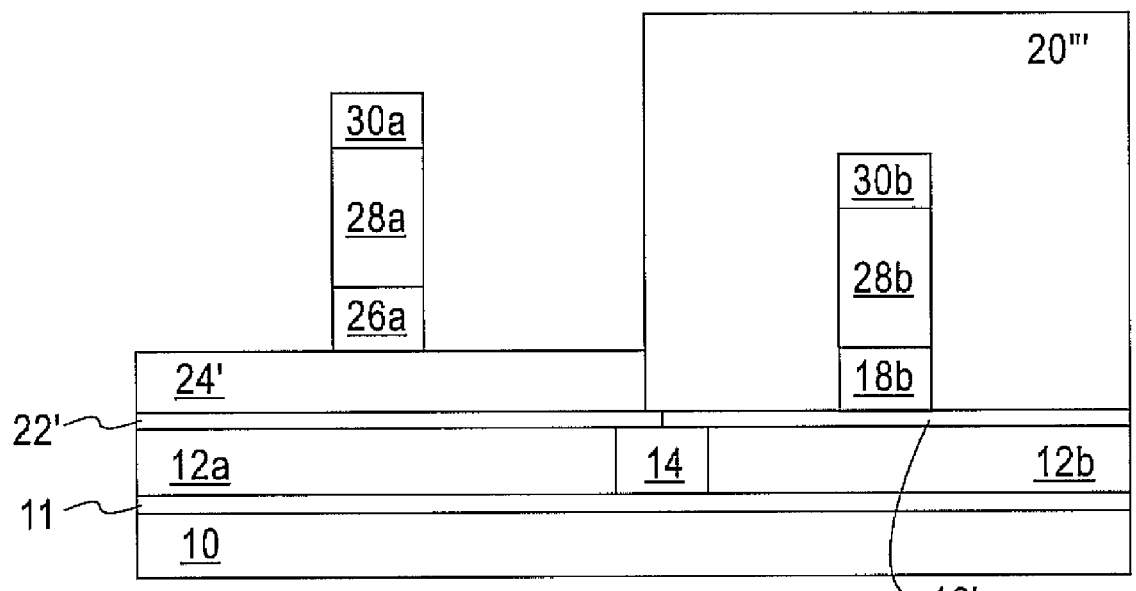

FIG. 11 first shows the results of stripping the photoresist layers 34a and 34b and the anti-reflective coating layers 32a and 32b from the CMOS structure whose schematic cross-sectional diagram is illustrated in FIG. 10. The foregoing layers may be stripped using methods and materials that are generally conventional in the semiconductor fabrication art. Again included, but again not limiting, are wet chemical etch methods, dry plasma etch methods and aggregate etch methods thereof.

FIG. 11 also shows a block mask layer 20''' located upon the right hand side of the CMOS structure of FIG. 11, and in particular covering the hard mask layer 30b, the silicon material layer 25b, the first gate electrode material layer 18b and the first gate dielectric material layer 16'. The block mask 20''' is generally analogous, equivalent or identical to the block mask 20 that is illustrated in FIG. 3, or the block mask 20'' that is illustrated in FIG. 6.

Figure 12:
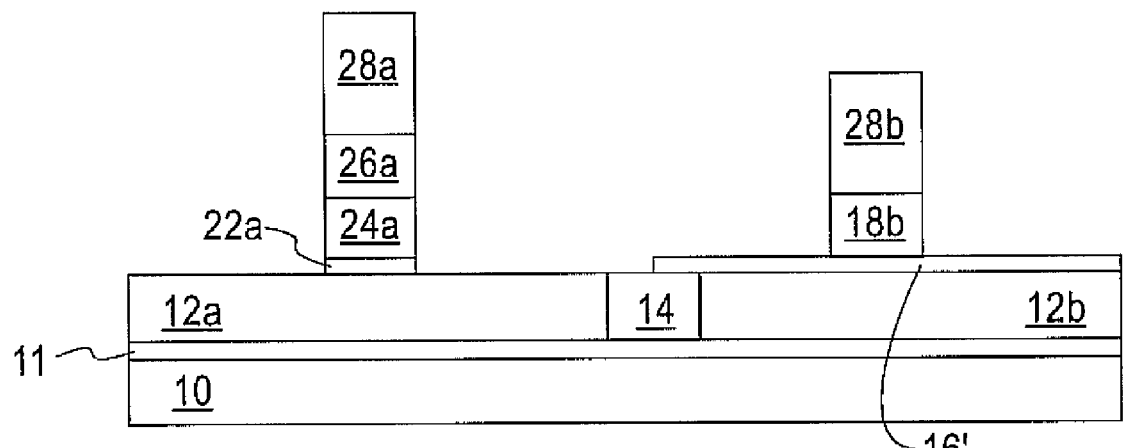

FIG. 12 first shows the results of etching the second gate electrode material layer 24' and the second gate dielectric material layer 22' to form a corresponding second gate electrode material layer 24a and second gate dielectric material layer 22a. The foregoing etching is effected while using the hard mask layer 30a and the block mask 20''' as an etch mask, and also while using an etchant gas composition appropriate to the materials from which are formed the second gate electrode material layer 24' and the second gate dielectric material layer 22'.

FIG. 12 also shows the results of sequentially stripping the block mask 20''', and then the hard mask layers 30a and 30b. The block mask 20''' may be stripped while using methods and materials analogous or equivalent to methods and materials that are used for stripping other block masks used in the instant embodiment. The hard masks 30a and 30b may be stripped using etching materials appropriate to the materials of composition of the hard masks 30a and 30b.

Figure 13:
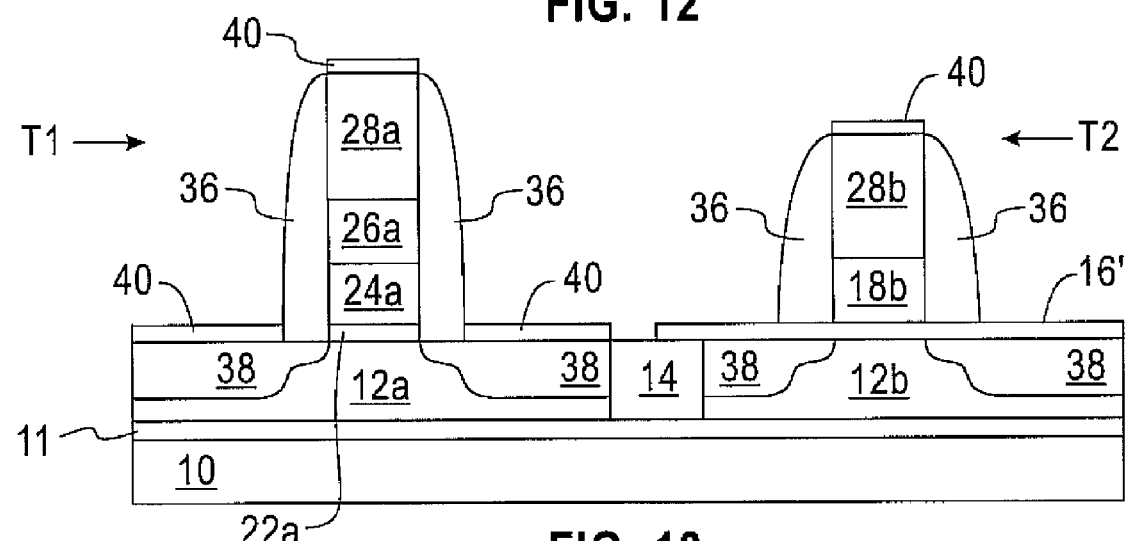

FIG. 13 first shows a plurality of spacers 36 located adjoining a pair of opposite sidewalls of: (1) a second gate stack that comprises the first gate electrode material layer 18b and the silicon material layer 28b; and (2) a first gate stack that comprises the second gate dielectric material layer 22a, the second gate electrode material layer 24a, the capping layer 26a and the silicon material layer 28a. FIG. 13 also shows a plurality of source/drain regions 38 located within the surface semiconductor layers 12a and 12b and separated by the foregoing first gate stack and the foregoing second gate stack. Each of the foregoing spacers 36 and source/drain regions 38 may comprise materials, have dimensions and be formed using methods that are conventional in the semiconductor fabrication art.

The spacers 36 may comprise spacer materials including but not limited to conductor spacer materials and dielectric spacer materials. Conductor spacer materials are less common, but are nonetheless known. Dielectric spacer materials are more common. The dielectric spacer materials may be formed using methods analogous, equivalent or identical to the methods that are used for forming other dielectric layers within the instant embodiment. The spacers 36 are also formed with the distinctive inward pointing spacer shape by using a blanket layer deposition and anisotropic etchback method.

The source/drain regions 38 comprises a generally conventional dopants of appropriate polarity. As is understood by a person skilled in the art, the source/drain regions 38 are formed using a two step ion implantation method. A first ion implantation process step within the method uses the above described gate stacks absent the spacers 36, as a mask to form a plurality of extension regions each of which extends beneath a particular spacer 36 (which in turn is intended as encircling a particular gate stack in plan view). A second ion implantation process step uses the gate stacks, along with the spacers 38, as a mask to form the larger contact region portions of the source/drain regions 38, while simultaneously incorporating the extension regions. Extension regions within the source/drain regions 38 may under certain circumstances be more lightly doped than contact regions with the source/drain regions 38, although such differential doping concentrations are not a requirement of the embodiment or of the invention.

FIG. 13 finally shows a plurality of silicide layers 40 located upon exposed silicon containing surfaces including: (1) the source/drain regions 38 within a transistor T1 but not a transistor T2; and (2) the silicon material layers 28a and 28b. The silicide layers 40 may comprise any of several silicide forming metals. Non-limiting examples of candidate silicide forming metals include nickel, cobalt, titanium, tungsten, erbium, ytterbium, platinum and vanadium silicide forming metals. Nickel and cobalt silicide forming metals are particularly common. Others of the above enumerated silicide forming metals are less common. Typically, the silicide layers 40 are formed using a salicide method. The salicide method includes: (1) forming a blanket silicide forming metal layer upon the semiconductor structure of FIG. 12 after forming the spacers 36 and the source/drain regions 38; (2) thermally annealing the blanket silicide forming metal layer with silicon surfaces which it contacts to selectively form the silicide layers 40 while leaving unreacted metal silicide forming metal layers on, for example, the spacers 38; and (3) selectively stripping unreacted portions of the silicide forming metal layers from, for example, the spacers 38. Typically, the silicide layers 40 comprise a nickel-platinum alloy silicide material or a cobalt silicide material that has a thickness from about 50 to about 200 angstroms.

FIG. 13 illustrates a CMOS structure in accordance with an embodiment of the invention. The CMOS structure includes a first transistor T1 intended as an nFET. The first transistor T1 is preferably fabricated using: (1) the surface semiconductor layer 12a that comprises a 100 silicon or silicon germanium alloy semiconductor material; (2) the second gate dielectric material layer 22a that comprises a generally higher dielectric constant dielectric material; and (3) the second gate electrode material layer 24a that comprises a metal material, along with the capping layer 26a that comprises a silicon material located thereupon and the silicon material layer 28a located further thereupon. The CMOS structure includes a second transistor T2 intended as a pFET. The second transistor T2 is preferably fabricated using: (1) the surface semiconductor layer 12b that comprises a 110 silicon or silicon germanium alloy semiconductor material; (2) the first gate dielectric material layer 16' that comprises a generally lower dielectric constant gate dielectric material; and (3) the first gate electrode material layer 18b that comprises a silicon or silicon-germanium alloy material, along with the silicon material layer 28b located thereupon. Thus, the CMOS structure whose schematic cross-sectional diagram is illustrated in FIG. 13 uses different semiconductor channel materials (including crystallographic orientation), gate dielectric materials and gate electrode materials, to optimize performance of the nFET transistor T1 and the pFET transistor T2.

When fabricating the CMOS structure whose schematic cross-sectional diagram is illustrated in FIG. 13, a first gate electrode material layer 18 (i.e., FIG. 1) from which is formed the first gate electrode material layer 18b is initially patterned with a tapered end to form a first gate electrode material layer 18' (i.e., FIG. 3). The tapered end is desirable since when etching a second gate electrode material layer 24 (i.e., FIG. 5) from which is formed the second gate electrode material layer 24a from upon the first gate electrode material layer 18' no residue of the second gate electrode material layer 24 is left adjoining the first gate electrode material layer 18'. The absence of such a residue is desirable incident to fabricating the CMOS structure of FIG. 13 since if such an undesirable residue is present efficient fabrication of the CMOS structure of FIG. 13 may be impeded.

The preferred embodiment of the invention is illustrative of the invention rather than limiting of the invention. Revisions and modifications may be made to materials, structures and dimensions of a semiconductor structure in accordance with the preferred embodiment, while still providing a method for fabricating a patterned layer in accordance with the invention, further in accordance with the accompanying claims.

What is claimed is:

1. A method for forming a patterned layer comprising:
   forming a mask layer over a target layer located over a substrate;
   etching the target layer while using the mask layer as an etch mask to provide a tapered target layer located over the substrate, the tapered target layer having a tapered end with an end taper from about 30 to about 80 degrees with respect to a plane of the substrate;
   forming a gate dielectric material layer directly on the tapered end and a surface of a semiconductor layer comprising a semiconductor material, wherein said semiconductor layer is different from the tapered target layer; and
   etching said gate dielectric material layer from above an entirety of said tapered end and from above an upper surface of said tapered layer, while an additional mask layer prevents removal of said gate dielectric material layer from above said surface of said semiconductor layer.

2. The method of claim 1 wherein the target layer comprises a material selected from the group consisting of conductor materials, semiconductor materials and dielectric materials.

3. The method of claim 1 wherein the target layer comprises a gate electrode material.

4. The method of claim 3 wherein the gate electrode material comprises a silicon material.

5. The method of claim 1 wherein the mask layer comprises a photoresist material.

6. The method of claim 1 wherein the etching the target layer also provides a tapered mask layer.

7. A method for forming a microelectronic structure comprising:
   forming a mask layer over a target layer located over a substrate;
   etching the target layer while using the mask layer as an etch mask to form a tapered target layer with a tapered end located over the substrate;
   stripping the mask layer from the tapered target layer;
   forming a gate dielectric material layer directly on the tapered end and a surface of a semiconductor layer comprising a semiconductor material, wherein said semiconductor layer is different from the tapered target layer;
   forming an additional target layer over the tapered target layer and the gate dielectric material layer;
   forming an additional mask layer over the additional target layer; and
   etching the additional target layer and the gate dielectric material layer from above an entirety of said tapered end and from above an upper surface of said tapered layer using the additional mask layer as an etch mask layer, while said additional mask layer prevents removal of said gate dielectric material layer from above said surface of said semiconductor layer.

8. The method of claim 7 wherein the tapered target layer has an end taper from about 30 to about 80 degrees with respect to a plane of the substrate.

9. The method of claim 7 wherein the target layer comprises a target material selected from the group consisting of conductor materials, semiconductor materials and dielectric materials.

10. The method of claim 7 wherein the additional target layer comprises a separate target material selected from the group consisting of conductor materials, semiconductor materials and dielectric materials.

11. The method of claim 7 wherein the target layer comprises a silicon gate electrode material.

12. The method of claim 7 wherein the additional target layer comprises a metal gate electrode material.

13. The method of claim 7 wherein each of the mask layer and the additional mask layer comprises a photoresist material.

14. The method of claim 13 wherein said target layer is etched employing a first etch method that provides a tapered mask layer, and said gate dielectric material layer is removed from above said entirety of said tapered end employing a second etch method that does not provide an additional tapered second mask layer.

15. The method of claim 14 wherein the first etch method uses an oxidant and the second etch method does not use an oxidant.

16. A method for fabricating a CMOS structure comprising:
   forming a first mask over a first gate electrode material layer located over a semiconductor substrate;
   etching the first gate electrode material layer while using the first mask as an etch mask to form a tapered first gate electrode material layer with a tapered end located over the semiconductor substrate;
   stripping the first mask from the tapered first gate electrode material layer;
   forming a gate dielectric material layer directly on the tapered end and a surface of a semiconductor layer comprising a semiconductor material, wherein said semiconductor layer is different from the tapered first gate electrode material layer;
   forming a second gate electrode material layer over the tapered first gate electrode material layer and the gate dielectric material layer;
   forming a second mask over the second gate electrode material layer; and
   etching the second gate electrode material layer and the gate dielectric material layer from above an entirety of said tapered end and from above an upper surface of said tapered first gate electrode material layer, while said second mask layer prevents removal of said second gate electrode material layer and said gate dielectric material layer from above said surface of said semiconductor layer.

17. The method of claim 16 wherein the tapered first gate electrode material layer has an end taper from about 30 to about 80 degrees.

18. The method of claim 16 wherein the first gate electrode material layer comprises a silicon gate electrode material.

19. The method of claim 16 wherein the second gate electrode material layer comprises a metal gate electrode material.

20. The method of claim 16 wherein the etching of the first gate electrode material layer uses a first etchant that comprises an oxidant to provide a tapered first mask from the first mask.

21. The method of claim 17 wherein the etching of the second gate electrode material layer uses a second etchant that does not comprise an oxidant so that a tapered second mask is not formed from the second mask.

22. A method for fabricating a CMOS structure comprising:
   forming a first mask over a first gate electrode material layer located over a first semiconductor material layer within a semiconductor substrate;
   etching the first gate electrode material layer while using the first mask as an etch mask to form a tapered first gate electrode material layer with a tapered end located over the first semiconductor material layer;

stripping the first mask from the tapered first gate electrode material layer;

forming a gate dielectric material layer directly on the tapered end and a surface of a semiconductor layer comprising a semiconductor material, wherein said semiconductor layer is different from the tapered first gate electrode material layer;

forming a second gate electrode material layer over the tapered first gate electrode material layer and over a different second semiconductor material layer and over the gate dielectric material layer within the semiconductor substrate;

forming a second mask over the second gate electrode material layer and the second semiconductor material layer; and etching the second gate electrode material layer and the gate dielectric material layer from above an entirety of said tapered end and from above an upper surface of said tapered first gate electrode material layer, while said second mask layer prevents removal of said second gate electrode material layer and said gate dielectric material layer from above said surface of said semiconductor layer.

23. The method of claim 22 wherein the tapered first gate electrode material layer has an end taper from about 30 to about 80 degrees.

24. The method of claim 22 wherein the first gate electrode material layer comprises a silicon gate electrode material.

25. The method of claim 22 wherein the second gate electrode material layer comprises a metal gate electrode material.

26. The method of claim 22 wherein the etching of the first gate electrode material layer uses a first etchant that comprises an oxidant to provide a tapered first mask from the first mask.

27. The method of claim 22 wherein the etching of the second gate electrode material layer uses a second etchant that does not comprise an oxidant so that a tapered second mask is not formed from the second mask.

28. The method of claim 22 wherein the forming of the first mask layer further includes forming a first gate dielectric material layer interposed between the first semiconductor material layer and the first gate electrode material layer.

29. The method of claim 28 wherein:
the first semiconductor material layer comprises a 110 silicon or silicon-germanium alloy semiconductor material;
the first gate dielectric material layer comprises a comparatively low dielectric constant gate dielectric material; and
the first gate electrode material layer comprises a silicon or silicon-germanium alloy gate electrode material.

30. The method of claim 22 further comprising forming a capping layer, wherein said capping layer is interposed between the second semiconductor material layer and the second mask layer.

31. The method of claim 30 wherein:
the second semiconductor material layer comprises a 100 silicon or silicon-germanium alloy semiconductor material;
the second gate dielectric material layer comprises a comparatively high dielectric constant gate dielectric material; and
the second gate electrode material layer comprises a metal gate electrode material.

* * * * *